United States Patent [19]

Sachs

[11] 4,310,957
[45] Jan. 19, 1982

[54] METHOD FOR THE MANUFACTURE OF ULTRASONIC HEADS

[75] Inventor: Bertram Sachs, Erlanger, Fed. Rep. of Germany

[73] Assignee: Siemens Aktiengesellschaft, Berlin and Munich, Fed. Rep. of Germany

[21] Appl. No.: 49,750

[22] Filed: Jun. 18, 1979

[30] Foreign Application Priority Data

Jul. 5, 1980 [DE] Fed. Rep. of Germany ....... 2829539

[51] Int. Cl.³ .......................................... H01L 41/22
[52] U.S. Cl. .................................. 29/25.35; 310/334; 310/368; 310/369
[58] Field of Search ............... 29/25.35, 417; 310/334, 310/369, 368, 326, 327

[56] References Cited

U.S. PATENT DOCUMENTS

| | | | |
|---|---|---|---|
| 2,864,013 | 12/1958 | Wood | 310/368 X |
| 3,543,058 | 11/1970 | Klemons | 310/334 X |
| 3,685,110 | 8/1972 | Randolph, Jr. | 29/25.35 |
| 4,101,795 | 7/1978 | Fukumoto | 310/336 |

OTHER PUBLICATIONS

Ultrasonics; Jul. 1968, pp. 153–159.
AAMI Twelfth Annual Meetings; Mar. 1977, San Francisco.

*Primary Examiner*—Carl E. Hall
*Attorney, Agent, or Firm*—Hill, Van Santen, Steadman, Chiara & Simpson

[57] ABSTRACT

In an exemplary embodiment, transducer combs for ultrasonic arrays or compound scanners, which consist of a specifiable number of transducer elements, are produced by a technically particularly simple and cost-saving manufacturing process, with the following method steps:

(a) a plurality of thin strips of transducer element material, in particular, piezo-material, are combined by cohesive bonding into a stack; e.g. on the basis of alternate interpositioning of spacing strips or on the basis of application of spacer beads on the transducer strips of piezoelectric material, (b) from the stack thus formed, individual packets are cut off transversely to the transducer strips, (c) each individual packet is completed as a transducer comb by itself.

12 Claims, 5 Drawing Figures

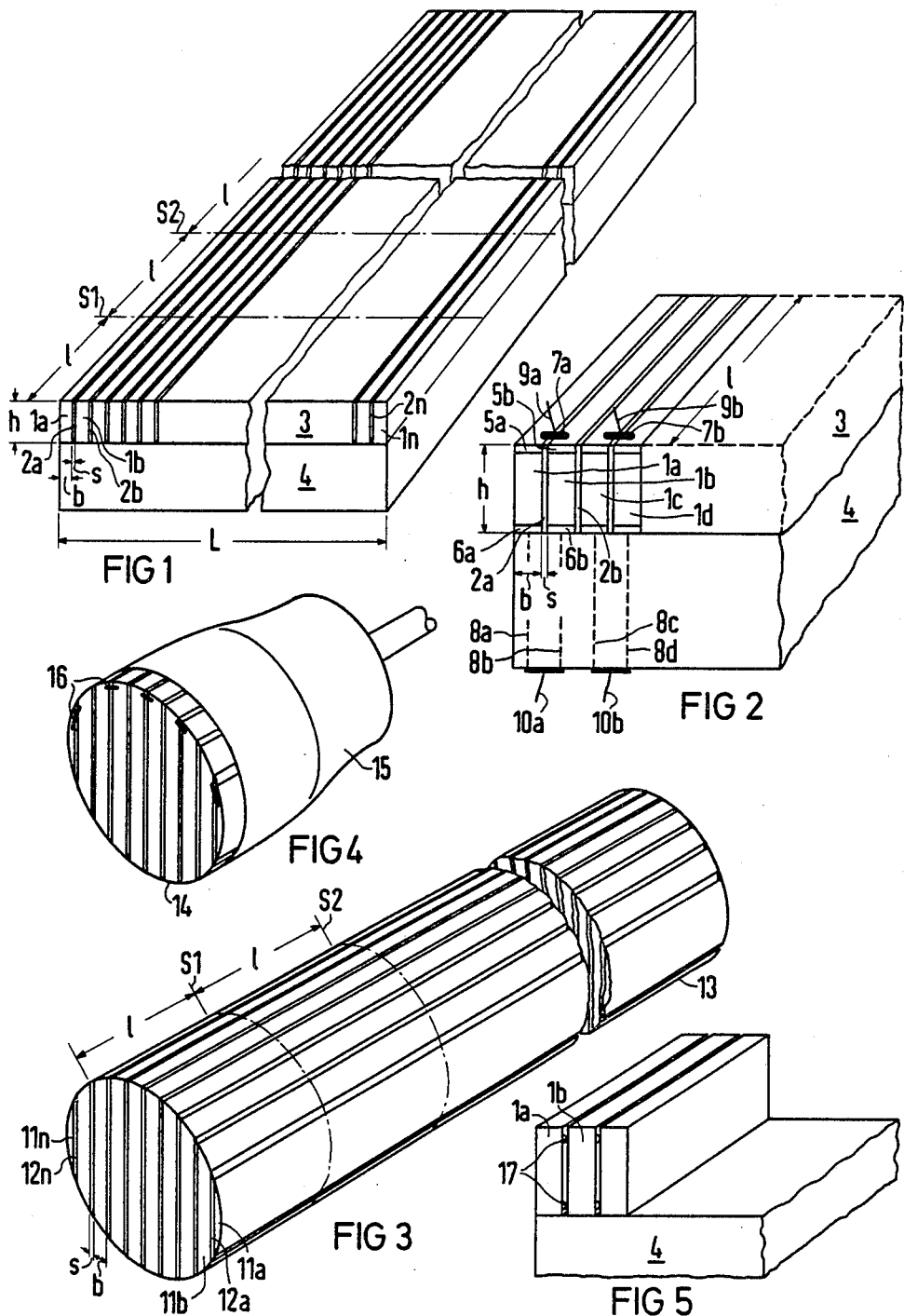

METHOD FOR THE MANUFACTURE OF ULTRASONIC HEADS

BACKGROUND OF THE INVENTION

The invention relates to a method for the manufacture of ultrasonic heads, in particular, transducer combs for ultrasonic arrays or compound scanners which comprise a specifiable number of combined (joined together) transducer elements.

The ultrasonic head can be a randomly shaped scan head for B-scan or also for A-scan or for a similar scanning procedure. In the present instance, it can also relate to an ultrasonic head for e.g. compound-scan. In a particular application, however, the sonic head should be the transducer comb of an ultrasonic array.

SUMMARY OF THE INVENTION

The object of the invention is the provision of such a method which renders possible a technically particularly simple and cost-saving manufacture of ultrasonic heads.

The object is solved in accordance with the invention by the following method steps:

(a) a plurality of thin strips consisting of transducer element material, particularly piezo-material, are combined by a cohesive bonding to form a stack of transducer strips by stacking one on top of another with a mutual spacing one from another; e.g. on the basis of alternate interpositioning of spacing strips or the application of spacers, (b) from the thus formed stack, individual packets are cut off transversely to the length of the strips, (c) each individual packet then itself forms a transducer comb.

In an advantageous embodiment of the invention, the thickness of the individual transducer strips of the stack is to manifest a value, at least at one location, which value clearly lies below half the wavelength ($\lambda/2$) of the ultrasonic waves to be radiated, or to be received, respectively. Adjacent transducer elements of the transducer comb thus obtained are then to be finally electrically contacted together in groups. The forming of electrical contacts for respective groups of adjacent transducer elements expediently proceeds by means of soldering. In a particular embodiment, the transducer strip thickness is to be selected smaller than $\lambda/4$. The thickness of the spacing strips or spacers which establishes the gap spacing between two adjacent transducer elements should preferably amount to a maximum of approximately 1/5 the thickness of the transducer strips of transducer element material. The fine thickness of the transducer strips results in individual transducers having an optimum lateral resolution. The electrical contacting to groups of transducer elements guarantees, in spite of fine thicknesses, a relatively large total radiation surface or receiving surface, respectively. Thus, with a substantially improved lateral resolution, the radiated or received power is then also optimum.

Further advantages and details of the invention result from the following description of exemplary embodiments on the basis of the accompanying sheet of drawing in conjunction with additional subclaims; and other objects, features and advantages will be apparent from this detailed disclosure and from the appended claims.

BRIEF DESCRIPTION OF THE DRAWING

FIG. 1 illustrates the manufacturing method according to the invention for a transducer comb for ultrasonic arrays;

FIG. 2 illustrates the method step of electrical contacting of individual groups;

FIG. 3 illustrates the manufacturing method according to the invention, applied in the case of round stacks;

FIG. 4 illustrates the utilization of a round stack section as the ultrasonic head for a compound scanner; and FIG. 5 illustrates a stack with beads on the transducer strips serving as spacers.

DETAILED DESCRIPTION OF THE DRAWINGS

In FIG. 1, in a first method step, a stack 3, whose constituents are secured together by thin cohesive transducer strips $1a$ through $1n$ consisting of piezo-material and spacing strips $2a$ through $2n$ consisting of e.g. epoxide resin. The thickness of each individual transducer strip of piezoelectric material is designated by (b) and the thickness of the spacing strip by (s). The height of each transducer strip, and the height of each spacing strip, respectively, is indicated by (h). The overall dimension of the stack longitudinally of the strips is designated by (L). The stack 3 thus formed is subsequently applied onto a carrier section 4 in a bonding fashion (e.g. by means of suitable adhesive). Subsequently, in a second method step, the cutting-off of individual packets proceeds by means of sawing or cutting along the cutting planes S1, S2, etc. The cutting spacings amount to (1) which thus indicates the length of the individual transducer elements of each transducer comb to be formed.

As illustrated, after formation of the stack 3, first the joining-together with the carrier section 4 can take place and then the cutting or sawing into individual packets. Likewise, however, the stack can also be first cut into individual packets and subsequently these individual packets can be bonded with allocated carrier sections. The individual sheets of piezo-material (e.g. barium-zirconate-titanate) are contact-coated to form electrical contacts by means of silver coating on their narrow surfaces, preferably already prior to joining together into a stack. Of course, however, through a suitable application technique, the silver contacting can also proceed only after completion of the stack.

In both instances, the shape of the transducer comb then results as illustrated in a cut-out enlargement in FIG. 2. The transducer strips are again n in number and may be designated by $1a$, $1b$, $1c$, and $1d$ through $1n$. Their silver contact layers on the upper side are designated by $5a$, $5b$, etc., and the corresponding silver layers on the underside are designated by $6a$, $6b$, etc. In a particular embodiment of FIGS. 1 and 2, the thickness (b) of the transducer strips manifests a value which likes markedly below half the wavelength ($\lambda/2$) of the ultrasonic waves to be radiated or to be received, respectively. In a preferred embodiment, the thickness should be less than $\lambda/4$ (b approximately 100 microns). There thus result, in the end effect, widths (b) for the individual transducer elements $2a$ through $2n$ of the transducer comb which always markedly lie below half the wavelength (e.g. at an operating ultrasonic frequency of 2.25 MHz). This signifies that the lateral resolution of the individual transducers is considerably improved.

The reduction in the transducer element widths (b) through selection of piezo-strips of minimal thickness would, however, lead to a reduction in the radiation- or receiving-power of each individual transducer element. However, the latter is avoided in that, in an advantageous additional method step, individual transducer elements are electrically contacted together in groups, so that, in spite of fine subdivision, the radiation or receiving surface, respectively, is enlarged again. In spite of a relatively high gap loss (the gap loss amounts to approximately 20% of the active surface), there then results, for everyindividual group of a transducer comb electrically contacted in this manner, at least the same radiation or receiving power, respectively, as for transducer combs of the state of the art, whereby, however, the lateral resolution is significantly improved.

The electrical contacting method in such a preferred method step is illustrated specifically by FIG. 2. The individual transducer elements 1a through 1n therein, which result from the stacking of the strips on top of one another, are contacted in groups of two adjacent elements, respectively. Thus, in the exemplary embodiment of FIG. 2, e.g. the transducer elements 1a and 1b form a first group; the transducer elements 1c and 1d, a second group, etc. The electrical contacting on the upper side is illustrated as being effected by soldering and is designated by 7a, 7b, etc. The contacting of the underside proceeds by means of soldering together the lead-through wires 8a, 8b, or 8c, 8d, respectively, etc. which extend through the carrier 4. Signal control lines 9a, 9b, etc., or 10a, 10b, etc., are then connected to every soldering contact location of a transducer element pair.

In practice, the ultrasonic array of FIGS. 1 and 2 may comprise a total of 256 individual transducers given an ultrasonic frequency of e.g. f=2.25 MHz. The width (b) of each individual transducer strip may be approximately 0.10 mm. The height (h) of the elements (width of the transducer strips) amounts to approximately 0.7 millimeter (h=0.7 mm), and the length, to approximately eleven millimeters (l=11 mm) for stack-sections formed by cutting at planes S1, S2, etc., (with spacing l), in FIG. 1. Given a gap width on the order of magnitude of 0.05 to 0.06 millimeter (s=0.05 to 0.06 mm), there thus results, pursuant to combining a total of two transducer elements into a group, an overall group width of approximately 0.25 mm, whereby the individual groups are separated with respect to one another along the transducer comb 3 by gap widths again on the order of magnitude of 0.5 to 0.6 millimeter (s=0.5 to 0.6 mm). In FIGS. 1 and 2, the laminations including the spacing strips have a constant height (h). However, other geometric configurations are likewise possible. FIG. 3 illustrates, by way of example, a configuration wherein sheets 11a through 11n and spacing strips 12a through 12n with varying heights (h) are joined together in such a manner that a stack 13, FIG. 3, having a round, in the present instance, a circular cross section, results. The round packets cut off at intervals defined by cutting planes S1, S2, can then form e.g. the transducer comb14 of a scan head 15 for compound scan; such a scan head for compound scan being schematically illustrated in FIG. 4. The spacing strips in the stacks of the embodiments of FIGS. 1 through 4 can also be replaced by differently fashioned spacers. FIG. 5 illustrates as an example of this, a stack with beads 17 deposited along the length of the strips 1a, 1b, etc. serving as spacers.

The disclosure of the related application of Borbourgh and Feigt, entitled "Ultrasonic Head", U.S. Ser. No. 049,898 filed June 19, 1979 is incorporated herein by reference particularly for illustrating different transducer element cross sections.

It will be apparent that many modifications and variations may be effected without departing from the scope of the novel concepts and teachings of the present invention.

I claim as my invention:

1. A method for manufacturing ultrasonic heads, particularly transducer combs for ultrasonic arrays or compound scanners, said method comprising combining a prescribable number of individual transducer elements comprised, in particular, of piezo material, with a prescribable cross-section and a prescribable length by means of an adhesive connection to form a packet with a prescribable shape of the cross-section and a packet length which corresponds to the length of the individual transducer elements and by means of stacking the transducer elements at an interval from one another, for example, on the basis of alternating interposition of spacing strips of a specific thickness or by applying spacing mounts to the individual elements, wherein the improvement comprises the following method steps:
  (a) combining a plurality of thin foils (1a through 1n; 11a through 11n) comprised of transducer element material, particularly piezo material, which are matched in their individual cross-sections to the cross-sections of transducer elements but whose lengths, however, amount to a multiple of the length (l) of an individual transducer element of a packet in an adhesive connection to form a foil stack (3; 13) by means of stacking them atop one another at an interval (2a through 2n; 12a through 12n),
  (b) cutting off individual packets from the foil stack (3; 13) formed in that manner in cross-cuts (S1, S2, etc.) which are placed at such intervals (l) from one another along the foil stack as correspond to the overall length of an individual transducer element, and
  (c) forming each individual packet into a transducer comb in and of itself, characterized in that transducer strips (11a through 11n) are separated by spacers (12a through 12n) and have varying heights joined together in such a manner that a stack (13) having a round cross section results.

2. A method for manufacturing ultrasonic transducer combs particularly for ultrasonic arrays or compound scanners, said method comprising
  (a) combining a specified number of layers of transducer element material, in particular of piezo material, with alternately interposed spacers (2a through 2n; 12a through 12n) of a specified thickness (s) by means of an adhesive connection to form a pack,
  (b) subsequently cutting the pack into a plurality of individual packets each of which forms a transducer comb comprised of respective transducer elements and such that each transducer element of each transducer comb has a width dimension corresponding to the width of the layer of transducer element material from which it is formed, such width dimension being in the direction of a lateral dimension extending through the successive layers of the individual packet, (c) forming said pack with said layers of said transducer element material each being in the form of a strip (1a through 1n; 11a through 11n) having a strip thickness (b) of not more than about 100 microns, and an original length greater than a corresponding dimension of transducer combs to be formed therefrom, (d) forming said individual packets by cutting the strips of said pack transversely to the original length of the strips so that the cut strips provide said corresponding dimension of the transducer combs, and (e) providing a mounting for said strips such that each mounted cut strip provides an outwardly directed ultrasonic radiating edge face with an edge-face width in the plane of said radiating edge face equal to said strip thickness (b) of not more than about 100 microns and having a height dimension at right angles to the plane of said radiating edge face which is substantially greater than said edge-face width, and with the successive cut strips of each packet being spaced apart by means of said spacers and forming a mounted transducer comb for ultrasonic transducing via the radiation edge faces of the associated cut strips.

3. A method according to claim 2, with the strips as secured together to form a pack having spacers therebetween of a thickness dimension (s) not greater than one-fifth of the strip thickness (b) so that the successive transducer elements of each mounted transducer comb have respective gaps therebetween of not greater than one-fifth the strip thickness (b).

4. A method according to claim 2, with the mounting of the strips being effected prior to the cutting thereof, and a common carrier (4) for the pack of strips being cut along with the cutting of the strips.

5. A method for manufacturing ultrasonic transducer combs particularly for ultrasonic arrays or compound scanners, said method comprising (a) combining a specified number of layers of transducer element material in a stack one on top of another with alternately interposed spacers (2a through 2n; 12a through 12n) of a specified thickness (s), by a cohesive connection to form a pack, (b) subsequently cutting the pack into a plurality of individual packets each comprised of respective transducer elements and such that each transducer element of each packet has a thickness dimension corresponding to the thickness of the layer of transducer element material from which it is formed, such thickness dimension being in the direction through the successive layers of the individual packet, (c) forming said pack with said layers of said transducer element material each being in the form of a strip (1a through 1n; 11a through 11n) having a strip thickness (b) greater than the thickness of the spacers and having an original length greater than a corresponding dimension of ultrasonic transducer combs to be formed therefrom, and with the strips of said pack having an original spacing corresponding to a desired spacing of transducer elements of the ultrasonic transducer combs to be formed therefrom, (d) forming unitary individual packets by cutting the strips of said pack transversely to the original length of the strips so that the cut strips provide said corresponding dimension of the ultrasonic transducer combs, and (e) forming an ultrasonic transducer comb from each unitary individual packet without disassembly of the strips so that the ultrasonic transducer combs so formed each have transducer elements with the thickness (b) of said strips and with said original spacing of said strips.

6. A method according to claim 5, characterized in that the thickness (b) of the individual transducer strips (1a through 1n; 11a through 11b) of the pack (3, 13), manifests, at at least one location, a value which lies markedly below half the wavelength ($\lambda/2$) of the ultrasonic waves.

7. A method according to claim 5, characterized in that adjacent transducer elements (1a, 1b, etc. or 11a, 11b, etc.) of the individual packet forming the transducer comb are electrically contacted together in groups.

8. A method according to claim 7, characterized in that the electrical contacting of groups of adjacent transducer elements, proceeds by means of soldering (soldering locations 7a, 7b, etc.; 16).

9. A method according to claim 6, characterized in that the strip thickness (b) is selected to be smaller than one-fourth the wavelength ($\lambda/4$) of the ultrasonic waves.

10. A method according to claim 6, characterized in that the thickness of the spacers (2a through 2n; 12a through 12n or 17) which establish the gap spacing (s) between two adjacent transducer elements amounts to a maximum of approximately 1/5 of the thickness (b) of the transducer strips of transducer element material.

11. A method according to claim 5, characterized in that the transducer strips (1a through 1n) of transducer element material are approximately of quadrilateral cross section.

12. A method according to claim 5, characterized in that the strip thickness (b) lies in the range of about one hundred microns (100 $\mu$m).

* * * * *